(12) United States Patent
Huang

(10) Patent No.: US 8,661,315 B2
(45) Date of Patent: Feb. 25, 2014

(54) EFUSE DEVICES, CORRECTION METHODS THEREOF, AND METHODS FOR OPERATING EFUSE DEVICES

(75) Inventor: Ruei-Fu Huang, Tainan County (TW)

(73) Assignee: Mediatek Inc., Hsin-Chu (TW)

( * ) Notice: Subject to any disclaimer, the term of this patent is extended or adjusted under 35 U.S.C. 154(b) by 365 days.

(21) Appl. No.: 12/574,765

(22) Filed: Oct. 7, 2009

(65) Prior Publication Data

US 2011/0083057 A1    Apr. 7, 2011

(51) Int. Cl.
*G11C 29/00* (2006.01)

(52) U.S. Cl.
USPC .......................................... 714/763

(58) Field of Classification Search
USPC ........... 714/42, 710, 758, 763, 764, 777, 785, 714/799–801, 803; 365/225.7
See application file for complete search history.

(56) References Cited

U.S. PATENT DOCUMENTS

| | | | | |
|---|---|---|---|---|
| 4,918,692 A | * | 4/1990 | Hidaka et al. | 714/702 |
| 5,140,597 A | * | 8/1992 | Araki | 714/805 |
| 6,400,292 B1 | * | 6/2002 | Maeno | 341/101 |
| 7,069,494 B2 | * | 6/2006 | Cargnoni et al. | 714/763 |
| 7,085,971 B2 | * | 8/2006 | Barth et al. | 714/710 |
| 7,280,415 B2 | * | 10/2007 | Hwang et al. | 365/189.09 |
| 2007/0226552 A1 | * | 9/2007 | Kushiyama et al. | 714/710 |
| 2010/0229062 A1 | * | 9/2010 | Henry et al. | 714/747 |

* cited by examiner

*Primary Examiner* — Scott Baderman
*Assistant Examiner* — Joseph Kudirka
(74) *Attorney, Agent, or Firm* — McClure, Qualey & Rodack, LLP

(57) ABSTRACT

An efuse device for recording input data according to address data comprises a first check-bit generator, a programming unit, and an efuse array. The first check-bit generator receives the input data and generates first check-bit data according to the input data by a predetermined error correction code. The programming unit generates blowing signals according to the input data and the first check-bit data. The efuse array receives the blowing signals and the address data. The input data and the first check-bit data are recorded in the efuse array according to the blowing signals and the address data.

35 Claims, 7 Drawing Sheets

| | $T_1$ | $T_2$ | $T_3$ | | $T_n$ |
|---|---|---|---|---|---|
| $WPL_1$ | 1 | 0 | 0 | ---------- | 0 |
| $WPL_2$ | 0 | 1 | 0 | ---------- | 0 |
| $WPL_3$ | 0 | 0 | 1 | ---------- | 0 |
| ⋮ | ⋮ | ⋮ | ⋮ | ⋮ | ⋮ |
| $WPL_n$ | 0 | 0 | 0 | ---------- | 1 |

|      | $T_1$ | $T_2$ | $T_3$ | ---- | $T_n$ |
|------|-------|-------|-------|------|-------|
| $WPL_1$ | 1 | 0 | 0 | ---- | 0 |
| $WPL_2$ | 0 | 1 | 0 | ---- | 0 |
| $WPL_3$ | 0 | 0 | 1 | ---- | 0 |
| ---- | | | | | |
| $WPL_n$ | 0 | 0 | 0 | ---- | 1 |

FIG. 3

EFUSE DEVICES, CORRECTION METHODS THEREOF, AND METHODS FOR OPERATING EFUSE DEVICES

BACKGROUND OF THE INVENTION

1. Field of the Invention

The invention relates to an efuse device, and more particularly to a correction method for an efuse device.

2. Description of the Related Art

Currently, efuse blowing is an important operation, and its performance depends on blowing voltage and blowing time. A DPPM (defects parts per million) test is a very important issue for efuse applications. If blowing conditions of an efuse array are not robust, the resistance values of the blown efuses vary, and the result of DPPM test is satisfied, so that yield of the efuse array is degraded. However, in practice, blowing conditions of efuse arrays can not optimally controlled.

Thus, it is desired to provide an efuse device and a correction method which can correct data read from an efuse array, thereby improving yield of the efuse array.

BRIEF SUMMARY OF THE INVENTION

An exemplary embodiment of an efuse device for recording input data according to address data comprises a first check-bit generator, a programming unit, and an efuse array. The first check-bit generator receives the input data and generates first check-bit data according to the input data by a predetermined error correction code. The programming unit generates blowing signals according to the input data and the first check-bit data. The efuse array receives the blowing signals and the address data. The input data and the first check-bit data are recorded in the efuse array according to the blowing signals and the address data.

An exemplary embodiment of an efuse device for recording input data according to address data comprises a first check-bit generator, a programming unit, an efuse array, a second check-bit generator, a syndrome generator, and a corrector. The first check-bit generator receives the input data and generates first check-bit data according to the input data. The programming unit is coupled to the first check-bit and generates blowing signals according to the input data, address data of the input data, and the first check-bit data. The efuse array records the input data and the first check-bit data in the efuse array according to the blowing signals and the address data. The second check-bit generator is coupled to the efuse array. The second check-bit generator reads recorded data from the efuse array according to the address data and generates a second check-bit data according to the recorded data by the predetermined error correction code. The syndrome generator is coupled to the second check-bit generator and generates a correction data according to the second check-bit. The corrector is coupled to the efuse array and the syndrome generator. The corrector reads a first portion of the recorded data from the efuse array and corrects the first portion of the recorded data by the correction data to generate output data.

An exemplary embodiment of a correction method for an efuse device comprises: providing input data; generating first check-bit data according to the input data by a predetermined error correction code; generating blowing signals according to the input data, the address data, and the first check-bit data; recording the input data and the first check-bit data in an efuse array of the efuse device according to the blowing signals and address data; reading recorded data from the efuse array according to the address data; generating a second check-bit data according to the recorded data by the predetermined error correction code; generating a correction data according to the second check-bit data; and correcting a first portion of the recorded data by the correction data to generate output data, wherein the first portion of the record data corresponds to the input data.

An exemplary embodiment of a method for operating an efuse device comprises: receiving input data; generating first check-bit data according to the input data by a predetermined error correction code; recording the input data into the efuse device; and recording the first check-bit data in a non-volatile memory.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 3 shows the blowing enabling signals $WPL_0$-$WPL_N$ in FIG. 2;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
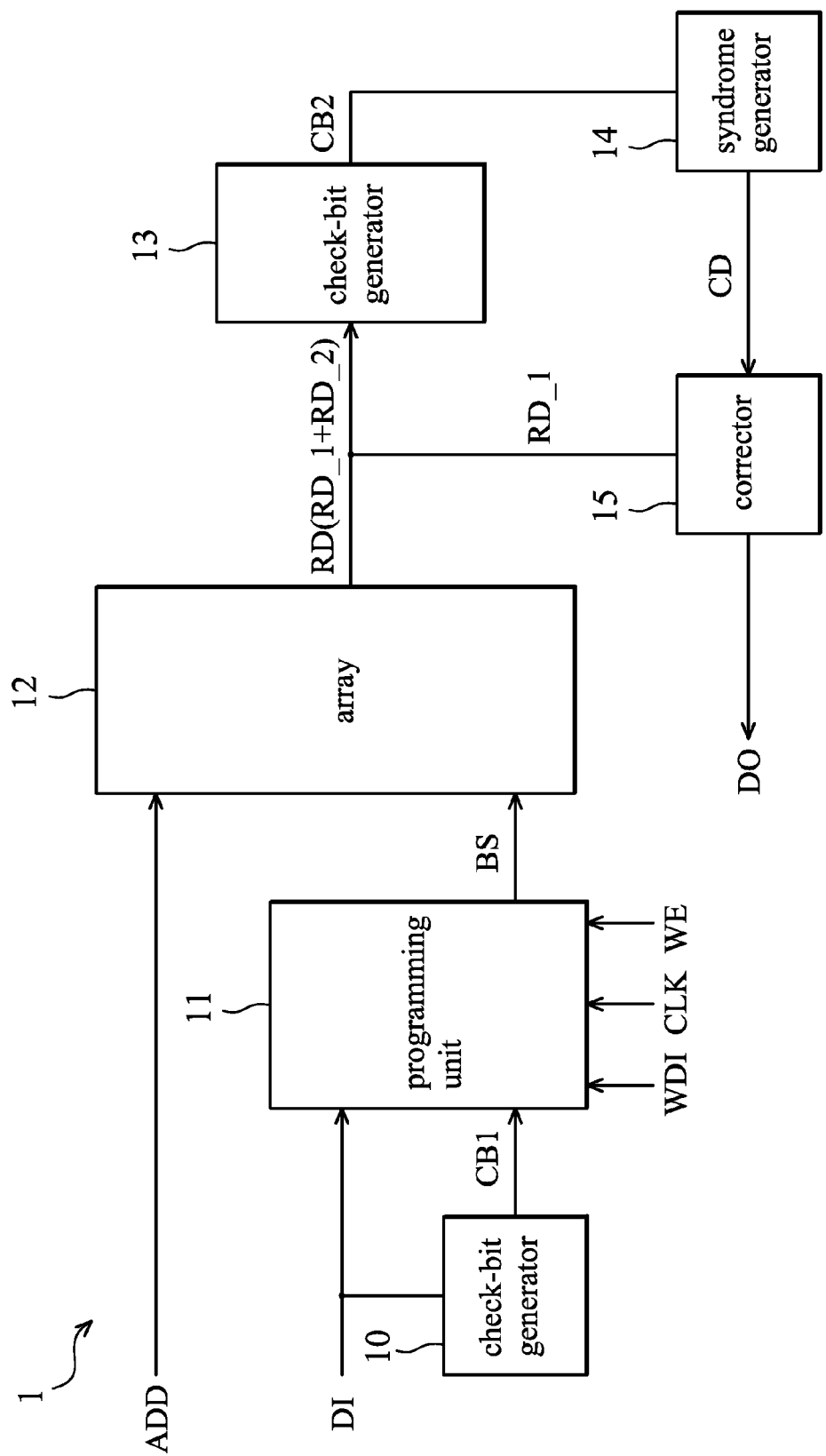
FIG. 1 shows an exemplary embodiment of an efuse device.

Efuse device are provided. In an exemplary embodiment of an efuse device in FIG. 1, an efuse device 1 comprises a check-bit generator 10, a programming unit 11, an efuse array 12, a check-bit data 13, a syndrome generator 14, and a corrector 15. Input data DI is provided. The efuse device 1 receives the input data DI and records input data DI in the efuse array 12 according to address data ADD. The check-bit generator 10 receives the input data DI and generates check-bit data CB1 according to the input data DI by a predetermined error correction code. In the embodiment, a Hamming code is given as an example of the predetermined error correction code. For example, the input data DI is "1100 0100" with 8 bits. The bit number of the check-bit data CB1 is 4 ($=\log_2 8+1$). The input data DI is combined with the check-bit data CB1 to generate a parity data PD (="P1 P2 P3 P4 P5 P6 P7 P8 P9 P10 P11 P12") with 12 bits, wherein the bits "1100 0100" of the input data DI are respectively disposed in the positions of the bits P3, P5, P6, P7, P9, P10, P11, and P12, and the four bits C1, C2, C3, and C4 of the check-bit data CB1 are respectively disposed in the positions of the bits P1, P2, P4, and P8. The parity data PD is represented by:

$$PD = P1\ P2\ P3\ P4\ P5\ P6\ P7\ P8\ P9\ P10\ P11\ P12$$
$$= C1\ C2\ 1\ C3\ 1\ 0\ 0\ C4\ 0\ 1\ 0\ 0,$$

wherein,
C1 (P1): $P3 \oplus P5 \oplus P7 \oplus P9 \oplus P11 = 1 \oplus 1 \oplus 0 \oplus 0 \oplus 0 = 0$,
C2 (P2): $P3 \oplus P6 \oplus P7 \oplus P10 \oplus P11 = 1 \oplus 0 \oplus 0 \oplus 1 \oplus 0 = 0$,
C3 (P4): $P5 \oplus P6 \oplus P7 \oplus P12 = 1 \oplus 0 \oplus 0 \oplus 0 = 1$, and
C4 (P8): $P9 \oplus P10 \oplus P11 \oplus P12 = 0 \oplus 1 \oplus 0 \oplus 0 = 1$.

Thus, the four bits C1, C2, C3, and C4 of the check-bit data CB1 are 0, 0, 1, and 1.

After the check-bit data CB1 is generated by the check-bit generator 10, the programming unit 11 receives the input data DI and the check-bit data CB1. In the programming unit 11, the input data DI and the check-bit data CB1 is represented by the parity data PD ("0011 1001 0100") with 12 bits.

Figure 2:
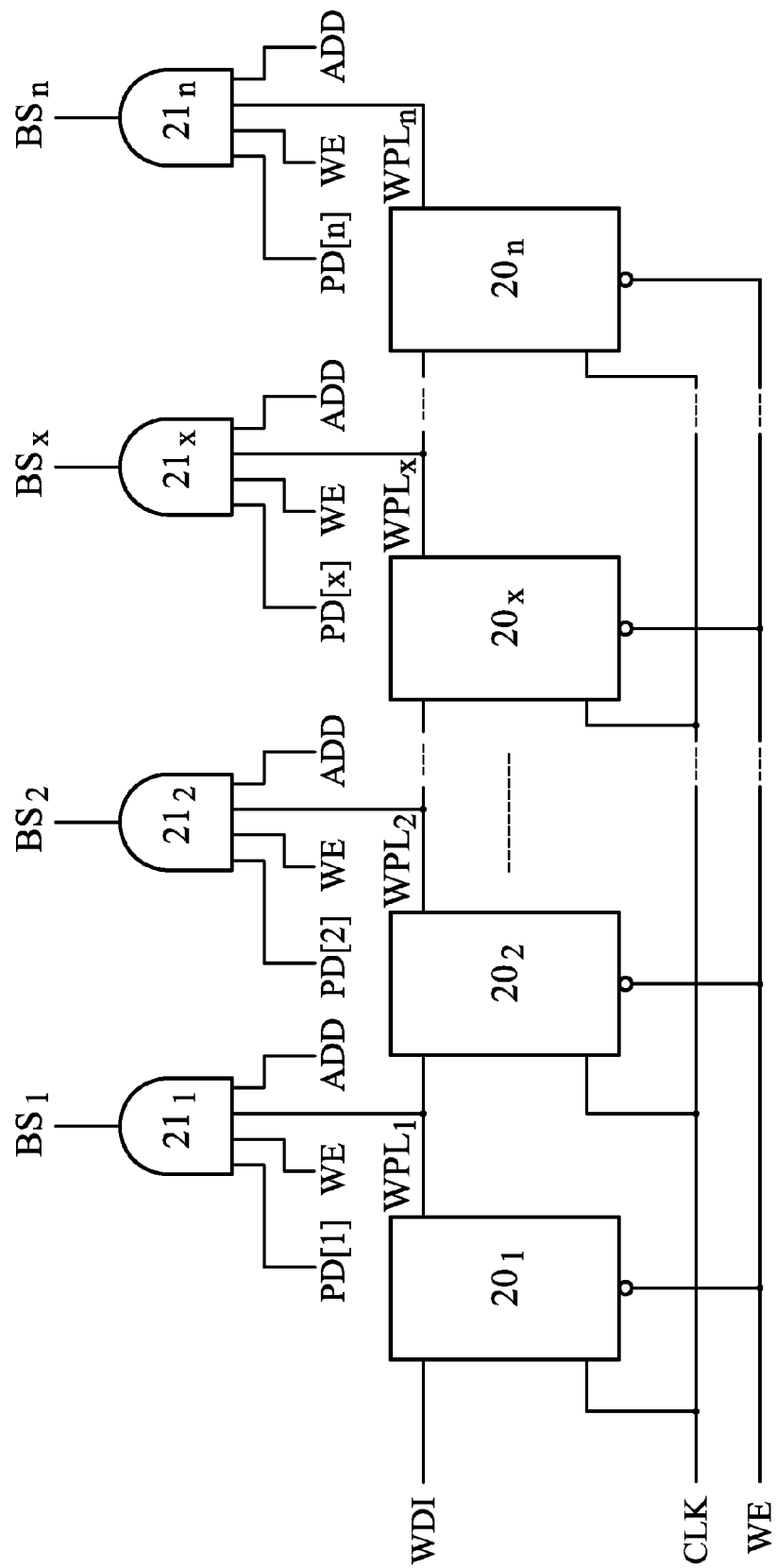
FIG. 2 shows an exemplary embodiment of a programming unit in the efuse device of FIG. 1.

Referring to FIG. 2, the programming unit 11 comprises a plurality of shift registers $20_1$-$20_N$ and a plurality of AND gates $21_1$-$20_N$. The shift registers $20_1$-$20_N$ are coupled in series, and each shift register is controlled by a clock signal CLK and a writing enabling signal WE which indicates that the efuse array 12 can be blown for recording the input data DI and check-bit data CB1 or that the input data DI and check-bit data CB1 can be recorded. The first shift registers $20_1$ further receives a pulse signal WDI. The shift registers $20_1$-$20_N$ respectively generates one-hot blowing enabling signals $WPL_1$-$WPL_N$ according to the pulse signal WDI, the clock signal CLK, and the writing enabling signal WE. The blowing enabling signals $WPL_1$-$WPL_N$ are activated successively, as shown in FIG. 3, wherein "1" represents that the blowing enabling signal has been activated, while "0" represents that the blowing enabling signal has not activated. For example, the blowing enabling signal $WPL_1$ is activated in a period $T_1$, and the blowing enabling signal $WPL_2$ is activated in a period $T_2$.

In some embodiments, the one-hot blowing enabling signals $WPL_1$-$WPL_N$ are generated by a clock source.

The AND gates $21_1$-$20_N$ receive the parity data PD, the address data ADD, the writing enabling signal WE, and the blowing enabling signals $WPL_1$-$WPL_N$. The AND gates $21_1$-$20_N$ generate blowing signals $BS_1$-BSn according to the parity data PD, the address data ADD, the writing enabling signal WE, and the blowing enabling signals $WPL_1$-$WPL_N$. In detail, each of the AND gates $21_1$-$20_N$ receives one PD[x] of the bits of the parity data PD, the address data ADD, and one of the blowing enabling signal $WPL_1$-$WPL_N$ and generates one corresponding blowing signal, wherein $1 \leq x \leq 12$ (the number of bits of the parity data PD in this embodiment). For example, the AND gates $21_1$ receives of the first bits PD[1] (i.e. "P1") of the parity data PD, the address data ADD, and the first (i.e. $WPL_1$) of the blowing enabling signal $WPL_1$-$WPL_N$ and generates the corresponding blowing signal.

Figure 4:
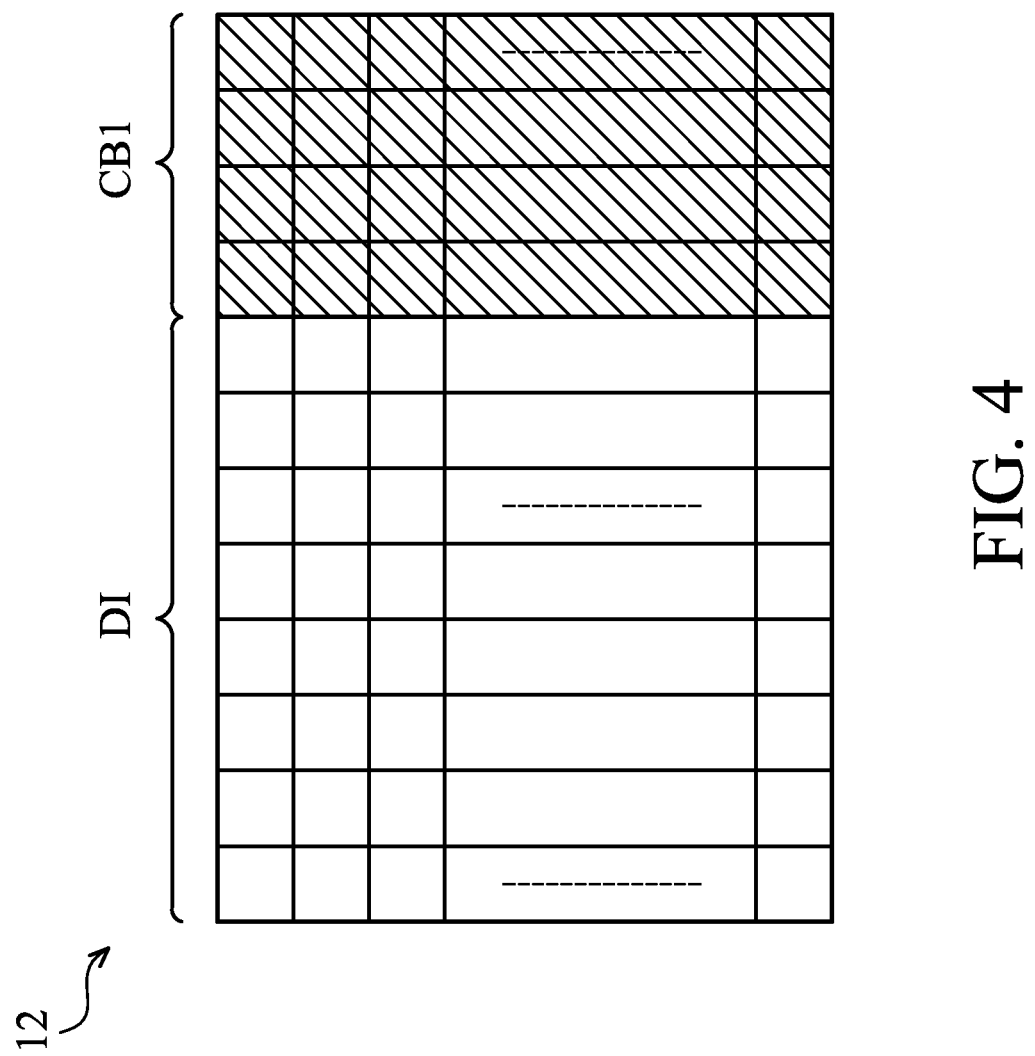
FIG. 4 shows the efuse array of FIG. 1 and the disposition of the parity data PD.

The efuse array 12 receives the blowing signals BS from the programming unit 11 and the address data ADD. The cells of the efuse array 12 are blown according to the blowing signals BS and the address data ADD. Since the blowing signals BS are generated according to the parity data PD and the blowing enabling signal $WPL_1$-$WPL_N$, in the embodiment, the input data DI and the check-bit data CB1 of the parity data PD is recorded in the corresponding cells of the efuse array 12 according to the address data ADD by a word-blowing mechanism. In another embodiment, the check-nit data CB1 can be recorded in another non-volatile memory, which is different from the efuse device 1, according to the blowing signals BS and the address data ADD. Referring to FIG. 4, the efuse array 12 comprises a plurality of columns and a plurality of rows. The parity data PD is recorded in the same row, wherein the input data DI is recorded in one group of congregated cells, and the check-bit data CB1 is another group of congregated cells following the input data DI. In some embodiments, the input data DI and the check-bit data CB1 of the parity data PD can be recorded in the cells in the same row of the efuse array 12 in any order.

The check-bit generator 13 reads recorded data RD from the efuse array 12 according to the address data ADD and generates a check-bit data CB2 according to the recorded data by the predetermined error correction code. The recorded data RD has two portions: the first portion RD_1 is related to the input data DI; and the second portion RD_2 is related to the check-bit data CB1. For the recorded data RD (="R1 R2 R3 R4 R5 R6 R7 R8 R9 R10 R11 R12") with 12 bits, the first portion RD_1 of the recorded data RD is respectively disposed in the positions of the bits R3, R5, R6, R7, R9, R10, R11, and R12, and the second portion RD_2 of the recorded data RD is disposed in the positions of the bits R1, R2, R4, and R8. Accordingly, the disposition of the bits of the two portions RD_1 and RD_2 of the recorded data RD corresponds to the disposition of the bits of the input data DI and the check-bit data CB1 of the parity data PD. The check-bit data CB2 has four bits RC1, RC2, RC3, and RC4, which are obtained by:

RC1: $R1 \oplus R3 \oplus R5 \oplus R7 \oplus R9 \oplus R11$,
RC2: $R2 \oplus R3 \oplus R6 \oplus R7 \oplus R10 \oplus R11$,
RC3: $R4 \oplus R5 \oplus R6 \oplus R7 \oplus R12$, and
RC4: $R8 \oplus R9 \oplus R10 \oplus R11 \oplus R12$.

The syndrome generator 14 receives the check-bit data CB2 with the bits RC1, RC2, RC3, and RC4. The syndrome generator 14 determines whether the first portion RD_1 of the recorded data RD is correct according to the check-bit data CB2 and generates correction data CD according to determination result. The first portion RD_1 of the recorded data RD has the same length as the correction data CD, and both have 8 bits. If RC4 RC3 RC2 RC1=0000, the syndrome generator 14 determines that the first portion RD_1 of the recorded data RD is correct. That is, the input data ID is correctly recorded in the efuse array 12. In this case, the syndrome generator 14 generates the correction data CD with "0000 0000". If RC4 RC3 RC2 RC1=0011, the syndrome generator 14 determines that the bit R3 (belonging to the first portion RD_1) of the recorded data RD is incorrect. That is, the last left bit "1" of the input data ID is incorrectly recorded in the efuse array 12. In this case, the syndrome generator 14 generates the correction data CD with "1000 0000".

Figure 5:
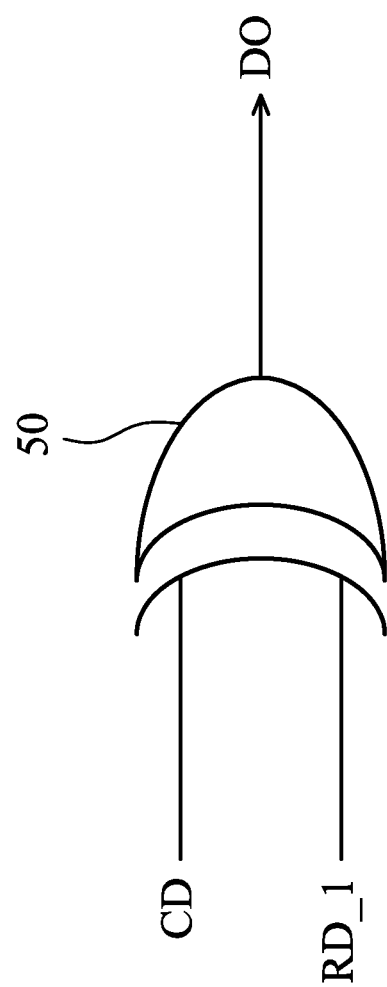
FIG. 5 shows an exemplary embodiment of a corrector in the efuse device of FIG. 1.

The corrector 15 reads the first portion RD_1 of the recorded data RD from the efuse array 12 according to the address data ADD and receives the correction data CD. The bits of the first portion RD_1 of the recorded data RD respectively correspond to the bits of the correction data CD. The corrector 15 corrects the first portion RD_1 of the recorded data RD by the correction data CD to generate output data DO. In some embodiments, referring to FIG. 5, the corrector 15 comprises an XOR gate 50 which receives the first portion RD_1 of the recorded data RD and the correction data CD and generates the output data DO. In the case that the bit R3 of the recorded data RD is incorrect, by performing a logic procedure of the XOR gate 50 to the first portion RD_1 of the recorded data RD and the correction data CD, the bit R3 of the recorded data RD is corrected. Accordingly, the output data DO is equal to the input data DI.

Figure 6:
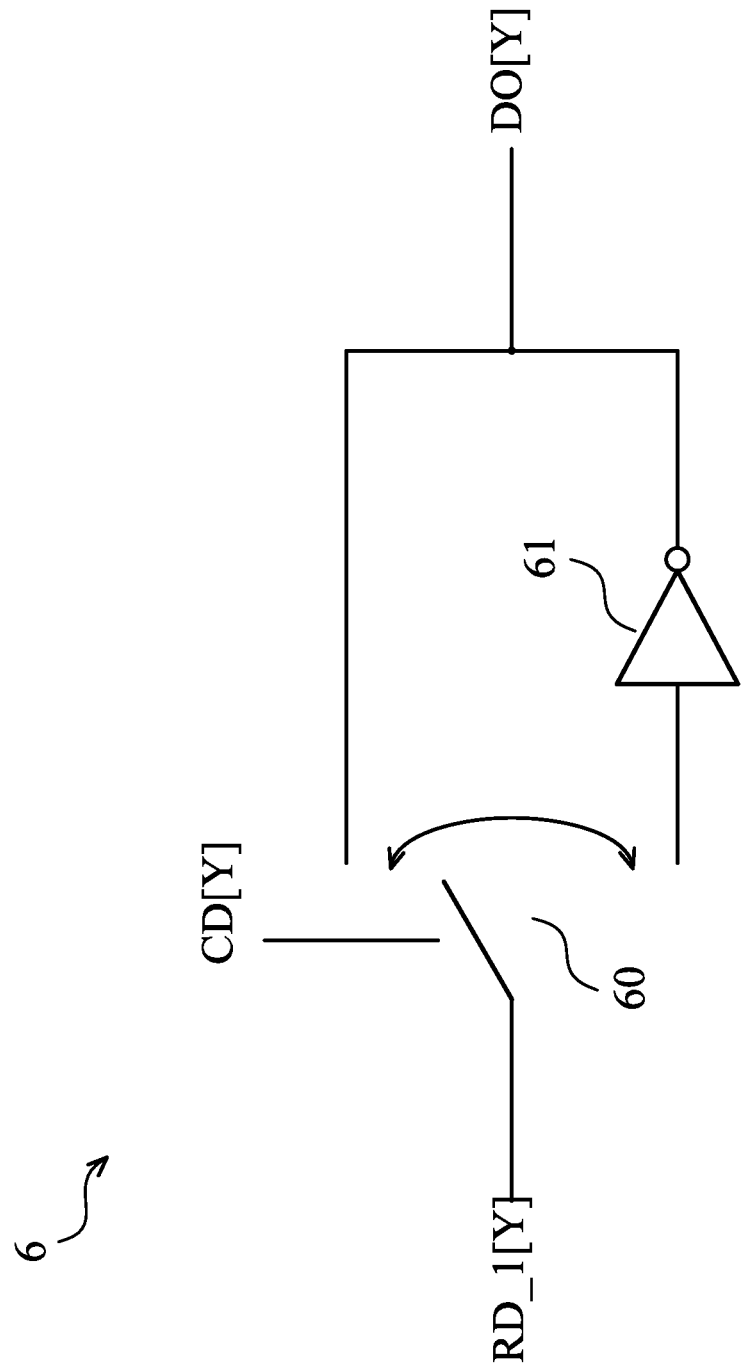
FIG. 6 shows another exemplary embodiment of a corrector in the efuse device of FIG. 1.

In some embodiments, the corrector 15 comprises a plurality of correction units. Referring to FIG. 6, one correction unit 6 is given as example. Each correction unit 6 comprises a switch 60 and an inverter 61. The switch 60 receives one bit RD_1[Y] of the first portion RD_1 of the recorded data RD and is controlled by the corresponding bit CD[Y] of the correction data CD, wherein 1≤Y≤8 (the number of bits of the first portion RD_1 in this embodiment). If one bit RD_1[Y] of the first portion RD_1 of the recorded data RD is required to be corrected, the switch 60 is closed according to the corresponding bit CD[Y] of the correction data CD, and the incorrect bit of the first portion RD_1 of the recorded data CD is inversed by the inverter 61 to serve as one bit DO[Y] of the output data DO. Through the operations of the correction units, the output data DO is corrected to be equal to the input data DI.

According to the above description, an error correction code is applied for the efuse device 1. Through the operation of the programming unit 11, the cells of the efuse 12 are blown by a word-blowing mechanism. The data read from the efuse array 12 can be corrected by the error correction code, enhancing yield of the efuse array.

Figure 7:
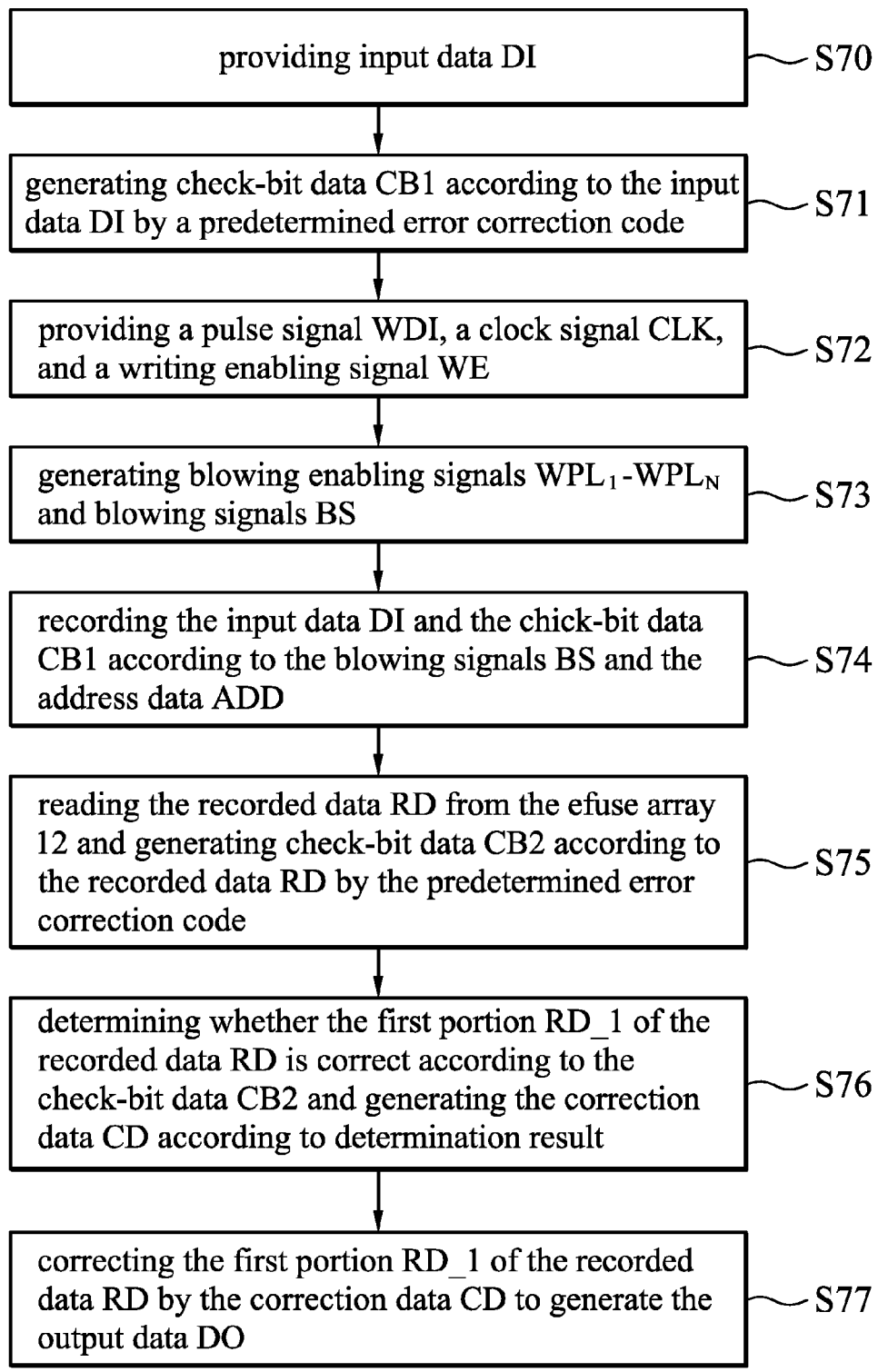
FIG. 7 is a flow chart of an exemplary embodiment of a correction method for an efuse device.

FIG. 7 is a flow chart of an exemplary embodiment of a correction method for operation of an efuse device. The correction method will be described according to FIGS. 1 and 7. First, input data DI is provided for recording (step S70), that is the efuse device 1 receives the input data DI. The check-bit generator 10 of the efuse device 1 generates check-bit data CB1 according to the input data DI by a predetermined error correction code (step S71). A pulse signal WDI, a clock signal CLK, and a writing enabling signal WE are provided (step S72), wherein the writing enabling signal WE indicates that the efuse array 12 of the efuse device 1 can be blown for recording the input data DI and the check-bit data CB1 or that the input data DI and the check-bit data CB1 can be recorded. The programming unit 11 of the efuse device 1 generates blowing enabling signals $WPL_1$-$WPL_N$ according to the pulse signal WDI, the clock signal CLK, and the writing enabling signal WE. The programming unit 11 further generates blowing signals BS according to the blowing enabling signals $WPL_0$-$WPL_N$, the input data DI, the address data ADD, and the check-bit data CB1 (step S73). In the embodiment, the input data DI and the check-bit data CB1 is recorded in the efuse array 12 of the efuse device 1 according to the blowing signals BS and the address data ADD (step S74). In another embodiment, the check-nit data CB1 can be recorded in another non-volatile memory, which is different from the efuse device 1, according to the blowing signals BS and the address data ADD. The check-bit generator 13 of the efuse device 1 reads the recorded data RD from the efuse array 12 according to the address data ADD and generates check-bit data CB2 according to the recorded data RD by the predetermined error correction code (step S75). The syndrome generator 14 of the efuse device 1 receives the check-bit data CB2. The syndrome generator 14 determines whether the first portion RD_1 of the recorded data RD is correct according to the check-bit data CB2 and generates the correction data CD according to determination result (step S76). The corrector 15 of the efuse device 1 receives the first portion RD_1 of the recorded data RD and the correction data CD and corrects the first portion RD_1 of the recorded data RD by the correction data CD to generate the output data DO (step S77).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An efuse device for recording input data according to address data comprising:
   a first check-bit generator for receiving the input data and generating first check-bit data according to the input data by a predetermined error correction code;
   a programming unit for generating blowing signals according to the input data and the first check-bit data; and
   an efuse array for receiving the blowing signals and the address data, wherein the input data and the first check-bit data are recorded in the efuse array by performing a one-hot blowing operation to change a resistance state of the efuse array according to the blowing signals and the address data,
   wherein the first check-bit data is not recorded in a DRAM.

2. The efuse device as claimed in claim 1, wherein the programming unit comprises:
   a plurality of shift registers for respectively generating a plurality of blowing enabling signals; and
   a plurality of logic gates for receiving the input data, the address data, and the first check-bit data and generating the blowing signals according to the blowing enabling signals, the input data, the address data, and the first check-bit data.

3. The efuse device as claimed in claim 2, wherein the shift registers receive a pulse signal, a clock signal, and a writing enabling signal and respectively generate the blowing enabling signals according to the pulse signal, the clock signal, and the writing enabling signal, wherein the writing enabling signal indicates the efuse array to be blown for recording the input data and the first check-bit data.

4. The efuse device as claimed in claim 2, wherein the input data is combined with the first check-bit data to generate a parity data having a plurality of bits, and the blowing enabling signals respectively correspond to the bits of the parity data.

5. The efuse device as claimed in claim 4, wherein each of the logic gates receives one of the bits of the parity data, the address data, and the corresponding blowing enabling signal and generates the corresponding blowing signal.

6. The efuse device as claimed in claim 5, wherein the efuse array comprises a plurality of cells, wherein one of the blowing signals respectively corresponds to one of the cells, and each of the cells is blown according to a corresponding blowing signal for recording a corresponding bit of the parity data.

7. The efuse device as claimed in claim 1 further comprising:
   a second check-bit generator for reading recorded data from the efuse array according to the address data and generating a second check-bit data according to the recorded data by the predetermined error correction code;
   a syndrome generator for receiving the second check-bit data and generating a correction data according to the second check-bit data; and
   a corrector for reading a first portion of the recorded data from the efuse array according to the address data, receiving the correction data, and correcting the first portion of the recorded data by the correction data to generate output data.

8. The efuse device as claimed in claim 7, wherein the syndrome generator determines whether the first portion of the recorded data is correct according to the second check-bit data and generates the correction data according to result of the determination of the syndrome generator.

9. The efuse device as claimed in claim 7, wherein the first portion of the recorded data has the same length as the correction data, and the output data is equal to the input data.

10. The efuse device as claimed in claim 7, wherein the corrector comprises an XOR gate for receiving the first portion of the recorded data and the correction data and generating the output data.

11. The efuse device as claimed in claim 7, wherein the corrector comprises:
a plurality of correction units, each correction unit receiving one bit of the first portion of the recorded data and controlled by one corresponding bit of the correction data,
wherein one bit of the first portion of the recorded data is corrected according to the corresponding bit of the correction data.

12. The efuse device as claimed in claim 11, wherein each of the correction units comprises:
a switch for receiving one bit of the first portion of the recorded data and controlled by the corresponding bit of the correction data; and
an inverter coupled to the switch,
wherein if one bit of the first portion of the recorded data is required to be corrected, the switch is closed according to the corresponding bit of the correction data, and the bit of the first portion of the recorded data is inverse by the inverter.

13. The efuse device as claimed in claim 1, wherein the predetermined error correction code is a Hamming code.

14. The efuse device as claimed in claim 1, wherein the input data and first check-bit data are recorded in the same row of the efuse array according to the address data.

15. The efuse device as claimed in claim 14, wherein the check-bit data follows the input data.

16. An efuse device for recording input data according to address data comprising:
a first check-bit generator for receiving the input data and generating first check-bit data according to the input data by a predetermined error correction code;
a programming unit, coupled to the first check-bit generator, for generating blowing signals according to the input data and the first check-bit data;
an efuse array for recording the input data and the first check-bit data in the efuse array by performing a one-hot blowing operation to change a resistance state of the efuse array according to the blowing signals and address data;
a second check-bit generator, coupled to the efuse array, for reading recorded data from the efuse array according to the address data and generating a second check-bit data according to the recorded data by the predetermined error correction code;
a syndrome generator, coupled to the second check-bit generator, for generating a correction data according to the second check-bit data; and
a corrector, coupled to the efuse array and the syndrome generator, for reading a first portion of the recorded data from the efuse array and correcting the first portion of the recorded data by the correction data to generate output data,
wherein the first check-bit data is not recorded in a DRAM.

17. The efuse device as claimed in claim 16, wherein the programming unit comprises:
a plurality of shift registers, coupled in series, for respectively generating a plurality of blowing enabling signals; and
a plurality of logic gates for receiving the input data, the address data, and the first check-bit data and generating the blowing signals according to the blowing enabling signals, the input data, the address data, and the first check-bit data.

18. The efuse device as claimed in claim 16, wherein the corrector comprises:
a plurality of correction units, each correction unit receiving one bit of the first portion of the recorded data and controlled by one corresponding bit of the correction data;
wherein one bit of the first portion of the recorded data is corrected according to the corresponding bit of the correction data.

19. The efuse device as claimed in claim 18, wherein each of the correction units comprises:
a switch for receiving one bit of the first portion of the recorded data and controlled by the corresponding bit of the correction data; and
an inverter coupled to the switch,
wherein if one bit of the first portion of the recorded data is required to be corrected, the switch is closed according to the corresponding bit of the correction data, and the bit of the first portion of the recorded data is inverse by the inverter.

20. The efuse device as claimed in claim 16, wherein the predetermined error correction code is a Hamming code.

21. A correction method for an efuse device comprising:
providing input data;
generating first check-bit data according to the input data by a predetermined error correction code;
generating blowing signals according to the input data, address data, and the first check-bit data;
recording the input data and the first check-bit data in an efuse array of the efuse device by performing a one-hot blowing operation to the efuse array to change a resistance state of the efuse array according to the blowing signals and the address data;
reading recorded data from the efuse array according to the address data;
generating a second check-bit data according to the recorded data by the predetermined error correction code;
generating a correction data according to the second check-bit data; and
correcting a first portion of the recorded data by the correction data to generate output data, wherein the first portion of the record data corresponds to the input data,
wherein the first check-bit data is not recorded in a DRAM.

22. The correction method as claimed in claim 21, wherein the step of generating the blowing signals comprises:
providing a pulse signal, a clock signal, and a writing enabling signal, wherein the writing enabling signal indicates the efuse array to be blown for recording the input data and the first check-bit data;
generating blowing enabling signals according to the pulse signal, the clock signal, and the writing enabling signal; and
generating the blowing signals according to the blowing enabling signals, the input data, the address data, and the first check-bit data.

23. The correction method as claimed in claim 22, wherein the input data is combined with the first check-bit data to generate a parity data having a plurality of bits, and the blowing enabling signals respectively correspond to the bits of the parity data.

24. The correction method as claimed in claim 23, wherein the step of recording the input data and the first check-bit data in the efuse array comprises blowing each of cells of the efuse array according to a corresponding blowing signal for recording acorresponding bit of the parity data.

25. The correction method as claimed in claim 21, wherein the step of generating the correction data comprises:
determining whether the first portion of the recorded data is correct according to the second check-bit data; and
generating the correction data according to a result of the determining.

26. The correction method as claimed in claim 21, wherein the first portion of the recorded data has the same length as the correction data, and the output data is equal to the input data.

27. The correction method as claimed in claim 21, wherein the step of correcting the first portion of the recorded data comprises performing an XOR logic procedure to the first portion of the recorded data and the correction data to generate the output data.

28. The correction method as claimed in claim 21, wherein the predetermined error correction code is a Hamming code.)

29. The correction method as claimed in claim 21, wherein the input data and the first check-bit data are recorded in the same row of the efuse array according to the address data.

30. A method for operating an efuse device, comprising:
receiving input data;
generating first check-bit data according to the input data by a predetermined error correction code;
recording the input data into the efuse device; and
recording the first check-bit data in the efuse device by performing a one-hot blowing operation to the efuse device to change a resistance state of the efuseeffuse device,
wherein the first check-bit data is not recorded in a DRAM.

31. The method as claimed in claim 30 further comprising:
receiving address data;
generating blowing signals according to the input data, address data, and the first check-bit data,
wherein the input data and the first check-bit data are recorded according to the blowing signals.

32. The method as claimed in claim 31, wherein the step of generating the blowing signals comprises:
receiving a pulse signal, a clock signal, and a writing enabling signal, wherein the writing enabling signal indicates that the input data and the first check-bit data are recorded;
generating blowing enabling signals according to the pulse signal, the clock signal, and the writing enabling signal; and
generating the blowing signals according to the blowing enabling signals, the input data, the address data, and the first check-bit data.

33. The method as claimed in claim 32, wherein the input data is combined with the first check-bit data to be recorded into the efuse device according to the blowing signals.

34. The method as claimed in claim 30, wherein the input data and the first check-bit data are recorded in the same row of an efuse array of the efuse device.

35. The method as claimed in claim 31, wherein the predetermined error correction code is a Hamming code.

* * * * *